United States Patent [19]

Boccon-Gibod

[11] Patent Number: 4,727,404
[45] Date of Patent: Feb. 23, 1988

[54] FIELD EFFECT TRANSISTOR OF THE MESFET TYPE FOR HIGH FREQUENCY APPLICATIONS AND METHOD OF MANUFACTURING SUCH A TRANSISTOR

[75] Inventor: Dominique Boccon-Gibod, Paris, France

[73] Assignee: U.S. Philips Corporation, New York, N.Y.

[21] Appl. No.: 945,165

[22] Filed: Dec. 19, 1986

Related U.S. Application Data

[63] Continuation of Ser. No. 690,437, Jan. 10, 1985, abandoned.

[30] Foreign Application Priority Data

Jan. 23, 1984 [FR] France ............... 84 00981

[51] Int. Cl.$^4$ .................. H01L 29/80; H01L 29/56
[52] U.S. Cl. ............................ 357/22; 357/51
[58] Field of Search ............ 357/22 R, 22 C, 22 F, 357/22 H, 22 I, 22 J, 22 K, 22 S, 23.1 (U.S. only), 23.6, 15, 51, 23.3 (U.S. only)

[56] References Cited

U.S. PATENT DOCUMENTS

| 3,372,069 | 3/1968 | Bailey et al. | 357/58 X |
| 3,675,313 | 7/1972 | Driver et al. | 357/22 X |
| 3,763,408 | 10/1973 | Kano et al. | 357/22 X |
| 3,920,861 | 11/1975 | Dean | 357/22 K X |
| 4,202,003 | 5/1980 | Darley et al. | 357/22 X |
| 4,338,616 | 7/1982 | Bol | 357/22 X |
| 4,375,643 | 3/1983 | Yeh et al. | 357/22 X |

Primary Examiner—Andrew J. James
Assistant Examiner—Sara W. Crane
Attorney, Agent, or Firm—Robert T. Mayer; Steven R. Biren

[57] ABSTRACT

A field effect transistor for high-frequency applications includes, on a monocrystalline semi-insulating substrate, a thin active n-doped layer of a material having a high electron mobility, on whose surface are deposited two ohmic contacts forming the source and drawing contact regions of the transistor, between which a metallic contact constitutes a gate electrode of the Schottky type. According to the invention, the transistor is characterized in that a dielectric layer is deposited on the active layer between the source and gate electrodes on the one hand and between the gate and drain electrodes on the other hand, and in that the metallic layer constituting the ohmic contacts is continuously prolonged on this dielectric layer without causing a short-circuit with the gate.

6 Claims, 10 Drawing Figures

FIELD EFFECT TRANSISTOR OF THE MESFET TYPE FOR HIGH FREQUENCY APPLICATIONS AND METHOD OF MANUFACTURING SUCH A TRANSISTOR This is a continuation of application Ser. No. 690,437, filed Jan. 10, 1985, now abandoned.

BACKGROUND OF THE INVENTION

The invention relates to a field effect transistor for high-frequency applications comprising on a semi-insulating monocrystalline substrate a thin active n-doped layer of a material having high electron mobility, on whose surface there is deposited a metallic layer constituting two ohmic contacts which form the source and drain contact regions of the transistor, between which a metallic contact constitutes a gate electrode of the Schottky type.

Such a transistor can be used both as a discrete element and as an element of an integrated circuit and it can be utilized in the high-frequency field.

The invention further relates to a method of manufacturing the transistor.

A transistor as described above is known from the publication of D. Boccon-Gibod in ACTA ELECTRONICA 23, 2, 1980, p. 99–109, entitled "Modele analytique et schema equivalent du transistor a effet de champ en arseniure de gallium".

The transistor described in the aforementioned publication is a MESFET (Metal- Semiconductor field effect transistor) of gallium arsenide (GaAs). A mono-crystalline substrate of semi-insulating gallium arsenide serves as a carrier for a thin layer of n-doped gallium arsenide. There are present on the surface of the n-type layer two ohmic contacts forming the source and the drain, between which a Schottky diode constitutes the gate contact and forms a depleted zone whose thickness essentially depends upon the n-doping of the layer and only slightly upon the metal forming the gate.

Under the gate, a current flows in the direction from drain to source, the value of which current depends upon the physical properties of the n-type layer and upon the geometric form of the conductive channel. The application of a voltage $V_{GS}$ between the gate and the source modifies the geometry of the channel and especially its thickness and hence the value of the current $I_D$ traversing the transistor for a voltage $V_{DS}$ between drain and source. The publication of C. Azizi and P. Rossel in ACTA ELECTRONICA 23, 3, 1080, p. 205–221, entitled "Modeles mathematiques due transistor a effet de champ en GaAs pour la conception assistee pour ordinateur des circuits" describes the operation of this transistor and provides an equivalent circuit diagram of it. The drain and source contacts constitute, with the gallium arsenide, contact zones which form resistances in series with the active part of the transistor.

This equivalent circuit diagram shows that it is of great importance to improve the performances of the transistor by reducing these contact resistances. Recent examinations have shown that such a field effect transistor made of a material having a high electron mobility is particularly suitable for use in high-frequency circuits.

SUMMARY OF THE INVENTION

Therefore, the invention has for its object to provide a novel field effect transistor, whose contact resistances are reduced at high-frequencies.

For this purpose, the field effect transistor of the kind described above is characterized in that a dielectric layer is disposed on the active layer between the source and drain electrodes on the one hand and between the gate and drain electrodes on the other hand, and in that the metallic layer constituting the ohmic contacts is prolonged continuously on this dielectric layer without causing a shortcircuit with the gate;

Under these conditions, the source-gate and gate-drain contact resistances are reduced due to the fact that at high frequencies a capacitance is obtained in each of these dielectric layers between the metallic layer of the ohmic contact covering them and the active n-type subjacent layer.

The invention moreover has for its object to provide a method of manufacturing such a transistor, this method comprising the following steps:
(a) Forming a monocrystalline semi-insulating substrate provided with a monocrystalline N-type layer,
(b) depositing a first dielectric layer having openings defining the source and drain contacts;
(c) depositing a continuous metallic layer having a metallic composition suitable to form ohmic source and drain contacts;
(d) depositing a second, thicker dielectric layer;
(e) depositing a photosensitive lacquer layer, which after treatment defines the opening corresponding to the gate contact;
(f) etching through this opening by means of a series of selective chemical attacks said second, thick dielectric layer, the continuous metallic layer, the first dielectric layer and a part of the thickness of the n-type active layer so that a cavity is formed therein;
(g) depositing a further metallic layer suitable to constitute the gate contact covering the assembly of the device and the bottom of said cavity,
(h) removing by dissolution the photosensitive lacquer layer together with said further metallic layer on top of it, while maintaining the said further metallic layer part of which has been deposited in the cavity and constitutes the gate, and
(i) dissolving at least in part the second thick dielectric layer.

According to a variation of this manufacturing method, $n^+$ -type islands may be formed in the n-type active layer in the openings defining the ohmic source and drain contacts before the deposition of the metallic layer constituting these contacts.

According to a particular embodiment, in which the transistor consists of gallium arsenide, the active layer may be obtained by local implantation of selenium ions $Se^+$), while the islands can be obtained by local implantation of sulphur ions ($S^+$).

According to another embodiment, the first dielectric layer, in which the source and drain openings are formed, may consist of a photosensitive lacquer.

According to a further embodiment these, the metallic layer constituting the ohmic contacts and covering the first dielectric layer may consist of a gold-germanium alloy.

Finally, according to a still further embodiment, the gate contact may be constituted by a muiltilayer of Ti-Pt.Au or Cr-Pt.Au.

BRIEF DESCRIPTION OF THE DRAWING

In order that the invention may be readily carried out, it will now be described more fully with reference to the accompanying drawing, in which.

Figure 1A:
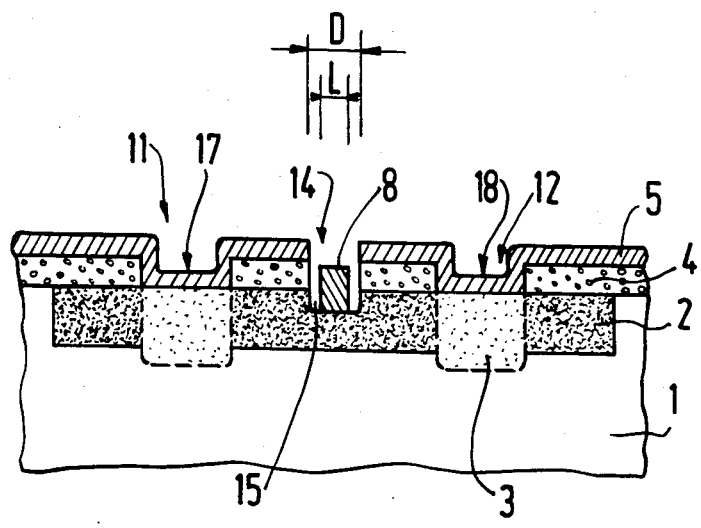
FIG. 1a is a cross-section of a transistor according to the invention and FIG. 1b shows the same transistor in plan view.

The Figures are not drawn to scale; for the sake of clarity, the dimensions in the direction of thickness of the transverse layer are strongly exaggerated.

In the various Figures, corresponding parts are designed by the same reference numerals.

DESCRIPTION OF THE PREFERRED EMBODIMENTS

As shown in FIG. 1a, the field effect transistor according to the invention comprises on a semi-insulating substrate 1 of high resistivity an n-type active layer 2 covered by a dielectric layer 4. The latter layer has on the one hand two openings 11 and 12 defining the area of the source and drain contacts 17 and 18, respectively, and on the other hand between these openings a third opening 14 defining the area of the gate contact 8. The opening 14 is prolonged into the active layer 2 so as to form therein a cavity 15, while the openings 11 and 12 only expose the surface thereof. A metallic layer 5 having a composition suitable to form an ohmic contact with the active layer is deposited in the openings 11 and 12 provided for this purpose as well as on the dielectric layer 4 so as to cover continuously the whole transistor except for the walls of the opening 14 and the walls and the bottom of the cavity 15. The gate contact 8 is constituted by depositing on the bottom of the cavity 15 provided in the active layer a metal suitable to form a Schottky contact. The length L of the gate 8 is slightly smaller than the transverse dimension D of the opening 14 and of the cavity 15 so that no shortcircuit can occur between the metallic layer 5 and the gate contact 8.

Figure 1B:
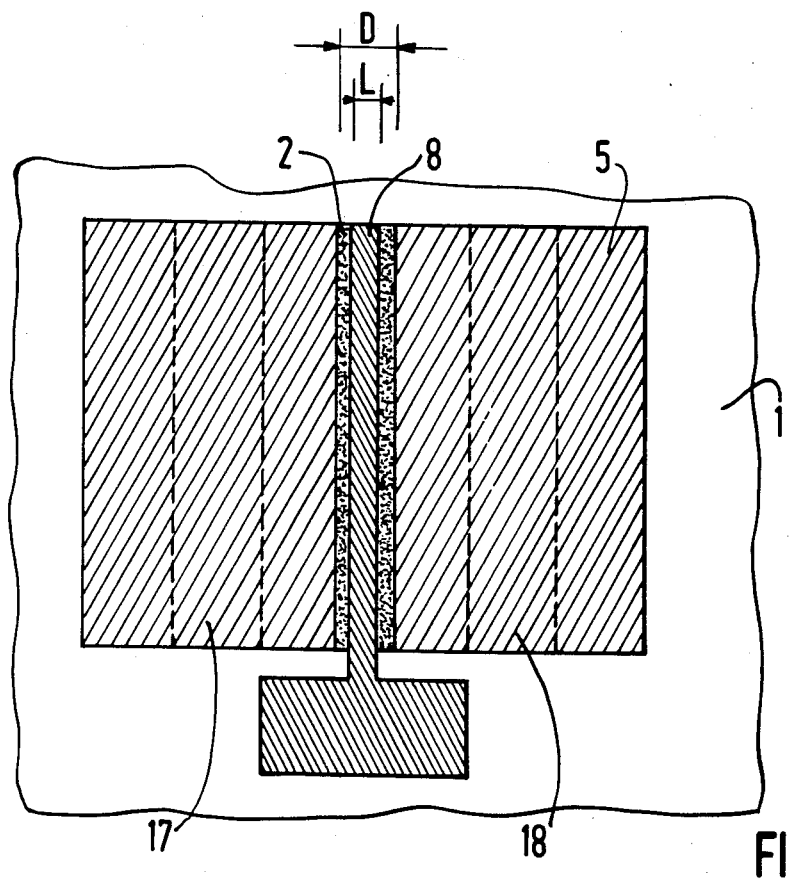

FIG. 1b shows the same transistor in plan view.

Figure 3:
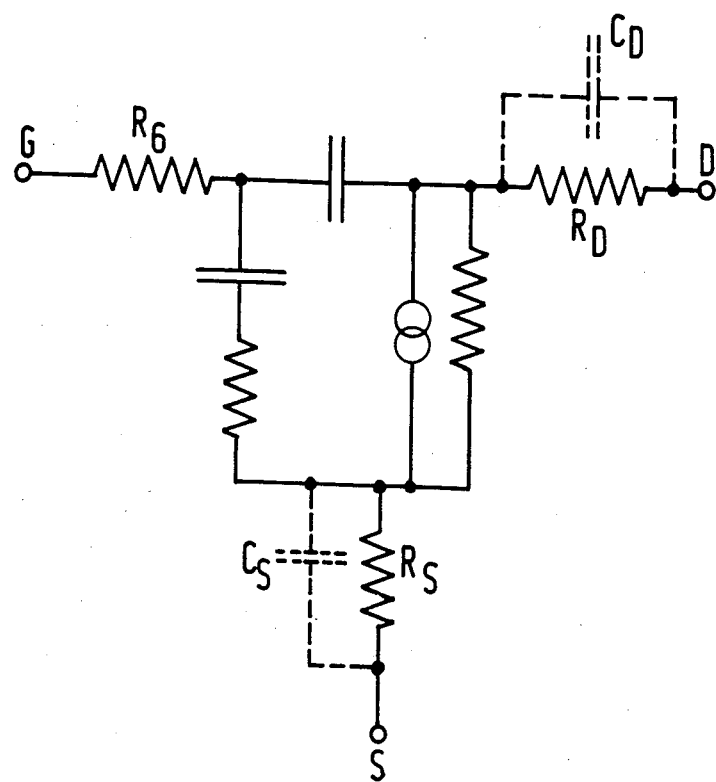
FIG. 3 shows the equivalent circuit diagram of the transistor operating at high frequencies.

Capacitances are formed by the dielectric layer 4 between the metallic layer 5 and the active layer 2. These capacitances, designated by $C_D$ and $C_S$, are arranged parallel to the contact resistances $R_D$ and $R_S$, respectively, as shown in the equivalent circuit diagram of the transistor in operation according to FIG. 3. At high frequencies, they shortcircuit the resistances $R_D$ and $R_S$ so that the performances of the transistor in operation can be improved and especially the value of the cut-off frequency can be increased.

In a preferred embodiment of such a transistor, n+ doped islands 3 are formed under the source and the drain. These islands reduce the resistances of the ohmic contacts.

FIG. 2 shows the various stages of the method of manufacturing the transistor according to the invention.

Figure 2A:
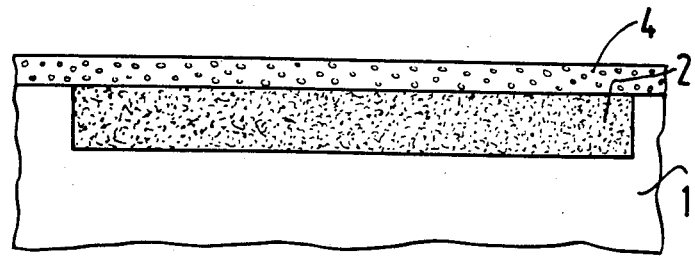
FIG. 2 shows the various stages of the method of manufacturing a transistor according to the invention.

As shown in FIG. 2a, in this method the starting material is a monocrystalline semi-insulating substrate 1 of high resistivity, in which an active n-type layer 2 is formed by means of, for example, ion implantation.

Figure 2B:
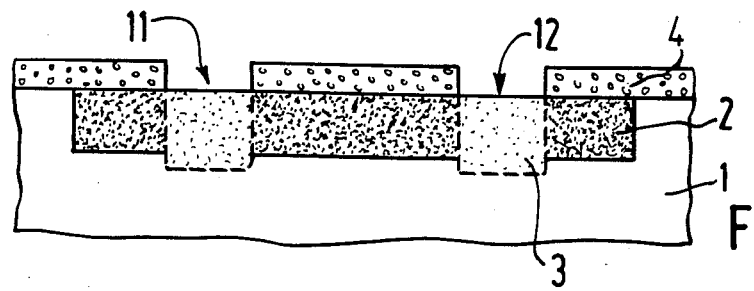

A dielectric layer 4 is deposited on the surface of the layer 2; the zones corresponding to the source and drain contacts are defined by a mask and openings 11 and 12 are formed in these zones by means of a suitable chemical treatment until the surface of the active layer 2 is exposed, which is shown in FIG. 2b. The dielectric layer 4 may be a photosensitive (photoresist) lacquer, which technologically is the most simple. However layer 4 may be of a different dielectric material, for example, polyimide, silicon dioxide or silicon nitride.

Optionally, through these openings islands 3 of the n+ type can be formed, for example, by means of ion implantation.

Figure 2C:
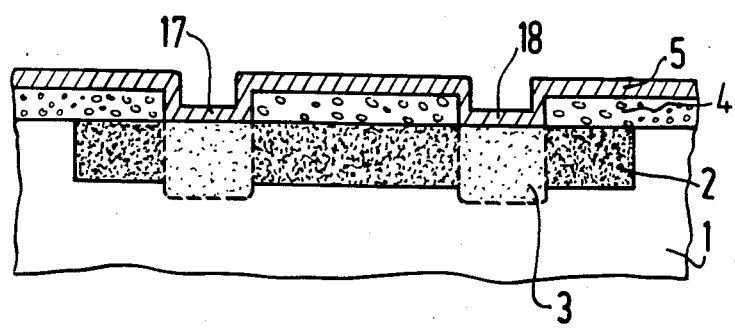

FIG. 2c shows that subsequently a metallic layer 5 having a composition suitable to form the ohmic contacts 17 and 18 with the layer 2 in the openings 11 and 12, respectively, is deposited continuously on the whole device.

Figure 2D:
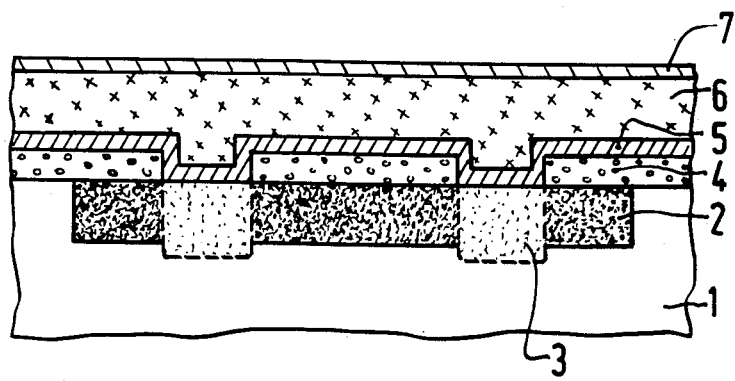

A dielectric layer 6, thick with respect to the level differences of the layer 5 and consisting e.g. of silicon dioxide or of polyimide is then deposited on the assembly thus formed. A photoresist layer 7 will cover the layer 6. This stage of the manufacturing method is shown in FIG. 2d.

Figure 2E:
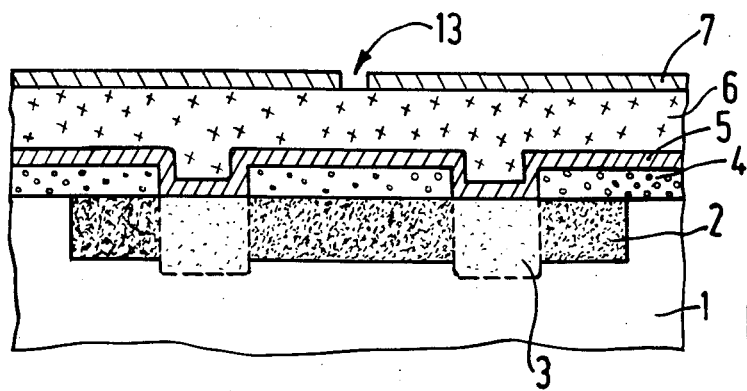

Subsequently, a mask defines on the photoresist layer 7 the position of the gate, while a suitable chemical treatment provides the opening 13 in the layer 7 at this area, which is shown in FIG. 2e.

Figure 2F:
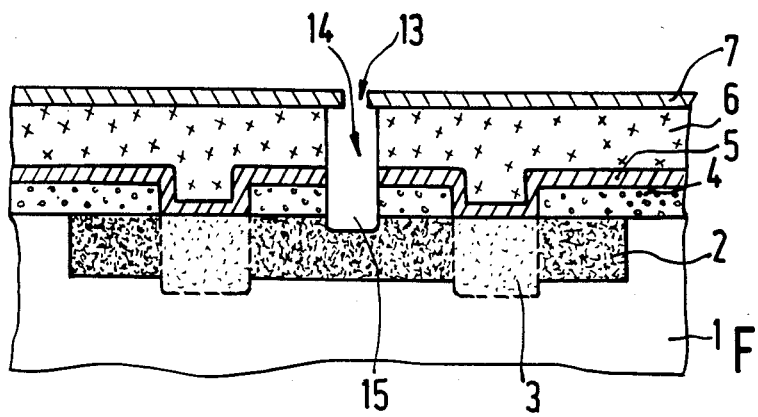

A selective chemical attack then permits forming, through this opening a cavity 14 in the thick dielectric layer 6, the metallic layer 5 and the dielectric layer 4 as well as a cavity 15 of small depth in the active layer 2. A slight underetching of the photoresist layer is moreover carried out so that the transverse length D of the cavities 14 and 15 is slightly larger than that of the opening 13 of the photoresist layer, which is chosen to be equal to the length L of the gate 8. This stage of the method is shown in FIG. 2f.

Figure 2G:
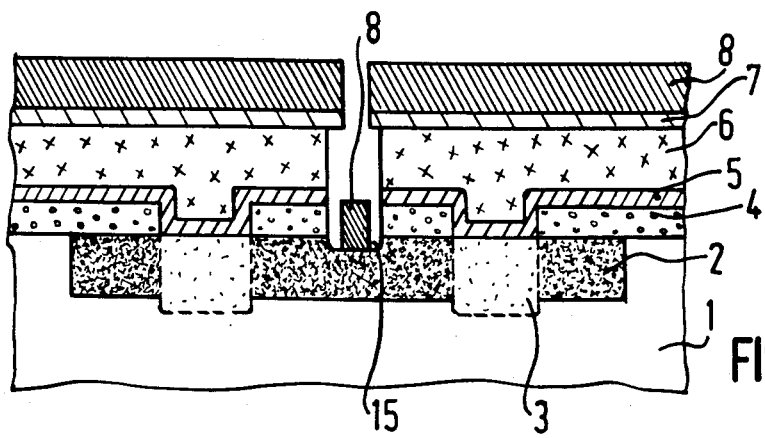

A metallic layer 8 of a metal suitable to form a Schottky contact on the n-type layer 2 is then deposited on the assembly thus obtained. This layer 8 will cover the assembly of the photoresist layer 7 as well as part of the bottom of the cavity 15 over the length defined by the opening 13 of the photoresist layer 7, which is shown in FIG. 2g.

A chemical treatment permits eliminating the layer 7 together with the part of the layer 8 covering it (so-called lift-off method) without deteriorating, however, the part of the layer 8 deposited on the bottom of the cavity 15 and constituting the gate contact. A supplementary chemical treatment permits removing the second thick dielectric layer 6 in part or entirely as a function of the openings that have to be provided to form the electrical connections of the transistor.

In a particular embodiment of this manufacturing method, the substrate 1 may consist of monocrystalline semiinsulating gallium arsenide having a resistivity $\rho \geq 10^8 \Omega$. cm. The n-type active layer 2 may then be obtained by a local implantation of selenium ions (Se+). The dielectric layer 4 may consist of photoresist, on which the alloy goldgermanium constitutes the ohmic contact laye 5 after formation of n+ type islands 3 by local implantation of sulphur ions (S+) in the openings 11 and 12 of the layer 4.

Finally, after deposition of a thick dielectric layer and a photoresist layer, a metallic multilayer of, for example, gold-copper-nickel or titanium-plantinum-gold or chromium- platinum-gold, may constitute the layer 8.

A field effect transistor thus obtained can be used both as a discrete element and as an element of an integrated circuit.

It will be appreciated that numerous variations are possible both as to the form and the dimensions of this transistor and as to the materials used in the manufacturing method without departing from the scope of the invention, as defined in the appended claims.

What is claimed is:

1. A field effect transistor for high-frequency applications comprising a semi-insulating monocrystalline substrate, a thin active n-doped layer of a material having a high electron mobility on said substrate, a metallic layer comprising two metallic layer portions comprising two ohmic contacts which form the source and drain contact regions of the transistor on the surface of said active layer, between which a metallic contact is provided on said active layer to form a gate electrode of the Schottky type, characterized in that a dielectric layer is disposed on and in direct contact with the active layer, said direct contact being over the entire extent of said dielectric layer between the source contact region and gate electrode and between the gate electrode and drain contact region, and in that the metallic layer comprising the ohmic contacts has a further part which extends continuously on the dielectric layer and forms a capacitance with said dielectric layer and only portions of said active layer other than said source and drain contact regions without contacting the gate electrode.

2. A field effect transistor as claimed in claim 1 characterized in that in the regions underlying the metallic layer forming the ohmic contacts, N+-type zones are present in the N-type active layer.

3. A field effect transistor as claimed in claim 1 or 2, characterized in that the substrate is of semi-insulating gallium arsenide.

4. A field effect transistor as claimed in 2 characterized in that the first dielectric layer is a photoresist layer.

5. A field effect transistor as claimed in 1 or 2, characterized in that the metallic layer forming the ohmic contacts and covering the first dielectric layer is an alloy of gold and germanium.

6. A field effect transistor as claimed in claim 1 or 2, characterized in that the metallic layer forming the gate electrode comprises a multilayer selected from the group consisting of titanium, platinum and gold or of chromium, platinum and gold.

* * * * *